(12) United States Patent
Gomi et al.

(10) Patent No.: US 9,976,217 B2
(45) Date of Patent: May 22, 2018

(54) FILM FORMING METHOD USING REVERSIBLE DECOMPOSITION REACTION

(71) Applicant: Tokyo Electron Limited, Tokyo (JP)

(72) Inventors: Atsushi Gomi, Yamanashi (JP);
Yasushi Mizusawa, Yamanashi (JP);
Tatsuo Hatano, Yamanashi (JP);
Masamichi Hara, Yamanashi (JP);
Kaoru Yamamoto, Yamanashi (JP);
Satoshi Taga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 14/511,399

(22) Filed: Oct. 10, 2014

(65) Prior Publication Data
US 2015/0044368 A1 Feb. 12, 2015

Related U.S. Application Data

(62) Division of application No. 13/057,380, filed as application No. PCT/JP2009/063823 on Aug. 4, 2009, now abandoned.

(30) Foreign Application Priority Data

Aug. 5, 2008 (JP) ................. 2008-202450

(51) Int. Cl.
*C23C 16/16* (2006.01)
*C23C 16/52* (2006.01)
(Continued)

(52) U.S. Cl.
CPC .............. *C23C 16/52* (2013.01); *C23C 16/16* (2013.01); *C23C 16/4585* (2013.01);
(Continued)

(58) Field of Classification Search
CPC ................. C23C 16/06; C23C 16/16
See application file for complete search history.

(56) References Cited

U.S. PATENT DOCUMENTS 5,304,248 A 4/1994 Cheng et al.
5,919,310 A * 7/1999 Fujioka ................. C23C 16/545
118/718

(Continued)

FOREIGN PATENT DOCUMENTS

EP 489439 A1 10/1992
JP 04-268724 A 9/1992
(Continued)

OTHER PUBLICATIONS

Oresmaa, Larisa, et al., "Ruthenium imidazole oxime carbonyls and their activities as CO-releasing molecules". Dalton Transactions, 2012, 41, 11170-11175.*

(Continued)

*Primary Examiner* — Bret P Chen
(74) *Attorney, Agent, or Firm* — Abelman, Frayne & Schwab

(57) ABSTRACT

The method of forming a thin film feeds a raw material gas causing a reversible decomposition reaction toward an upper surface of substrate placed on a placing table in a processing container; decomposes the raw material gas with a predetermined decomposing scheme thereby forming a thin film of the raw material gas on the surface of the substrate; and feeds a decomposition restraint gas having a characteristic of restraining a thermal decomposition of the raw material gas separately from the raw material gas toward a peripheral portion of the substrate when the raw material gas is fed to the substrate, thereby restraining the thermal decomposition (Continued)

of the raw material gas and selectively preventing the thin film from being formed in the peripheral portion of the substrate.

4 Claims, 6 Drawing Sheets

(51) Int. Cl.
    *C23C 16/455*     (2006.01)
    *C23C 16/458*     (2006.01)
    *H01L 21/67*     (2006.01)
    *H01L 21/687*     (2006.01)

(52) U.S. Cl.
    CPC .. *C23C 16/45514* (2013.01); *C23C 16/45521* (2013.01); *C23C 16/45597* (2013.01); *H01L 21/67017* (2013.01); *H01L 21/68785* (2013.01)

(56) References Cited

U.S. PATENT DOCUMENTS

| | | | |
|---|---|---|---|
| 6,040,011 A | 3/2000 | Yudovsky et al. | |
| 6,159,299 A | 12/2000 | Koai et al. | |
| 6,454,909 B1 | 9/2002 | Matsuse et al. | |
| 6,797,068 B1 | 9/2004 | Yamasaki et al. | |
| 7,070,660 B2 | 7/2006 | Keeton et al. | |
| 7,446,859 B2 | 11/2008 | Shneyder et al. | |
| 2001/0042514 A1 | 11/2001 | Mizuno et al. | |
| 2003/0205324 A1* | 11/2003 | Keeton | C23C 16/45521 156/345.5 |
| 2004/0241321 A1* | 12/2004 | Ganguli | C23C 16/18 427/255.28 |
| 2005/0092439 A1 | 5/2005 | Keeton et al. | |
| 2006/0220248 A1* | 10/2006 | Suzuki | C23C 16/045 257/751 |
| 2006/0223310 A1* | 10/2006 | Suzuki | C23C 16/16 438/652 |
| 2006/0246690 A1* | 11/2006 | Dordi | C25D 17/06 438/478 |
| 2007/0072415 A1* | 3/2007 | Suzuki | C23C 16/18 438/652 |
| 2007/0218200 A1 | 9/2007 | Suzuki et al. | |
| 2008/0003360 A1* | 1/2008 | Suzuki | C23C 16/16 427/250 |
| 2009/0280245 A1* | 11/2009 | Krebs | C09D 5/24 427/226 |

FOREIGN PATENT DOCUMENTS

| | | |
|---|---|---|
| JP | 06-062534 U | 10/1993 |
| JP | 2001-023966 A | 1/2001 |
| JP | 2001-329370 A | 11/2001 |
| JP | 2003-007694 A | 1/2003 |
| JP | 2007-247062 A | 9/2007 |

OTHER PUBLICATIONS

Mayer, T.M., et al., "Deposition of chromium films by multiphoton dissociation of chromium hexacarbonyl". J. Appl. Phys. 53(12), Dec. 1982, pp. 8462-8469.*
Zaera, Francisco, "Tungsten Hexacarbonyl Thermal Decomposition on Ni(100) Surfaces". J. Phys. Chem. 1992, 96, 4609-4615.*
International Search Report dated Oct. 27, 2009 for WO2010/016499 A1.

* cited by examiner

FILM FORMING METHOD USING REVERSIBLE DECOMPOSITION REACTION

CROSS REFERENCE TO RELATED APPLICATIONS

This application is a divisional of U.S. patent application Ser. No. 13/057,380, filed on Apr. 29, 2012, which is a U.S. national stage application of International Application No. PCT/JP2009/063823, filed on Aug. 4, 2009 and has been abandoned, claiming priority from Japanese Application No. 2008-202450, filed on Aug. 5, 2008, the disclosures of which are incorporated herein by reference.

TECHNICAL FIELD

The disclosure relates to a placing table structure used for a thin film forming apparatus to form a thin film on a subject to be processed, such as a semiconductor wafer.

BACKGROUND ART

In general, when a semiconductor integrated circuit is manufactured, various heating processes, such as film forming, etching, annealing, modifying and crystallizing process, are repeatedly performed with respect to the subject to be processed, such as the semiconductor wafer, to form a desired integrated circuit. For instance, in the case of a single type film forming apparatus, which forms a film on semiconductor wafers one by one, a placing table equipped with a resistance heater is installed in an evacuable processing container and a semiconductor wafer is loaded on a top surface of the placing table. In this state, a film forming gas is injected into a processing space so that a thin film is formed on the semiconductor wafer under a predetermined process condition.

Such a thin film can be formed through the thermal decomposition of raw material gas. For instance, the thin film can be formed through a CVD (chemical vapor deposition) process disclosed in, for example, Japanese Unexamined Patent Publication Nos. 2001-023966 and 2003-007694.

When the thin film is formed through the above process, the thin film is of course formed on a top surface of the semiconductor wafer. However, since the film forming gas may be introduced into a gap between a back surface of the wafer and the placing table by way of a peripheral portion and a lateral side of the wafer, the thin film may also be formed from the peripheral portion to the entire lateral side of the wafer. In other words, the thin film may be formed on a bevel portion of the wafer to a certain degree as well as a back surface of the peripheral portion of the wafer.

The thin film unnecessarily deposited on the bevel portion or the back surface of the wafer may be delaminated in the subsequent processes, so the particles are generated or contamination may occur caused by the thin film unnecessarily deposited on the bevel portion or the back surface of the wafer.

In particular, the critical dimensions of the semiconductor device have recently become finer, so the process conditions tend to be set with high step coverage to ensure the embeddability for various holes or recesses formed in the surface of the wafer. That is, the film forming gas may tend to flow through the bevel portion or the back surface of the wafer, thereby causing the above problems.

In order to solve the above problems, there is provided a method for preventing the formation of undesired thin films by introducing a purge gas such an inert gas to the peripheral portion of the wafer. However, if the purge gas which is not related to the thin film formation is introduced into the processing space, the thin film may not be formed on a local area of the wafer due to the purge gas, so that thickness uniformity of the thin film may be degraded.

In particular, a precious metal thin film is recently formed by using metal carbonyl gas as raw material gas to reduce the contact resistance. When the precious metal thin film is formed, the process condition tends to be set with the high step coverage, so it is necessary to solve the above problems to provide the precious metal thin film having high quality.

SUMMARY

The present invention has been made to solve the above problems occurring the in prior art, and an object of the present invention is to provide a placing table structure capable of preventing formation of a thin film on a bevel portion and a back surface of a subject to be processed while improving the thickness uniformity of the thin film by supplying decomposition restraint gas to a peripheral portion of the subject to be processed, while appropriately restraining the thermal decomposition of the raw material gas, when the thin film is formed by using the raw material gas causing a reversible thermal decomposition reaction.

According to the present invention, a placing table structure is installed in a processing container to place a subject to be processed thereon when a thin film is formed on the subject in the processing chamber by using a raw material gas causing a reversible thermal decomposition reaction. The placing table structure includes a placing table to place the subject on a placing surface, which is a top surface of the placing table, and a decomposition restraint gas feeding unit installed in the placing table to feed a decomposition restraint gas, which restrains the thermal decomposition of the raw material gas, to a peripheral portion of the subject placed on the placing surface of the placing table.

According to the present invention, when the thin film is formed by using the raw material gas causing the reversible thermal decomposition reaction, the decomposition restraint gas is fed toward the peripheral portion of the subject to be processed from a decomposition restraint gas feeding unit, so that the thermal decomposition of the raw material gas is restrained. Thus, the thin film can be formed on the top surface of the subject to be processed with a uniform thickness while preventing formation of the thin film on the bevel portion and the back side of the subject to be processed.

According to the exemplary embodiment of the disclosure, the decomposition restraint gas feeding unit includes a gas discharge port formed along a circumference of the placing table corresponding to the peripheral portion of the subject placed on the placing surface of the placing table, a gas path communicated with the gas discharge port, and a decomposition restraint gas source connected to the gas path to store a decomposition restraint gas.

In this case, the gas discharge port is preferably communicated with the gas path through an annular diffusion chamber formed in the placing table, along the circumference of the placing table.

For example, the gas discharge port includes an annular slit formed along the circumference of the placing table.

Alternatively, the gas discharge port includes a plurality of exhaust holes formed along the circumference of the placing table in a predetermined interval.

Also, a recess is preferably formed in the placing surface to receive the subject to be processed therein and the recess has a depth corresponding to a thickness of the subject to be processed.

Also, the placing surface is preferably formed in the circumference thereof with an annular groove to define a gas staying space to temporally stay the decomposition restraint gas.

Also, the placing table is preferably provided with a ring member having a shape of a thin ring plate and positioned at an outer peripheral portion of the subject to be processed.

In this case, the ring member is preferably movable up and down and serves as a clamp ring having an inner peripheral portion of the ring member making contact with a top surface of the peripheral portion of the subject to be processed to press the subject.

Alternatively, the ring member preferably serves as a cover ring to prevent the thin film from being formed on a region where the ring member is disposed.

Also, the placing table is preferably provided therein with a heating unit to heat the subject to be processed.

Also, the decomposition restraint gas preferably has a composition identical to a composition of a gas generated through a thermal decomposition reaction of the raw material gas.

Also, the raw material gas preferably includes a metal carbonyl raw material gas.

For example, the metal carbonyl raw material gas includes at least one selected from the group consisting of $Ru_3(CO)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$ and $Ta(CO)_5$.

Also, a thin film forming apparatus is provided to form a thin film on a subject to be processed. The thin film forming apparatus includes a processing container having a gas exhaust function, a placing table structure having one of the above features, and a gas feeding unit to feed a raw material gas causing a reversible thermal decomposition reaction to the processing container.

Alternatively, the present invention provides a method of forming a thin film on a subject to be processed, which is placed on a placing table in a processing container, by using a raw material gas causing a reversible thermal decomposition reaction. The method includes feeding the raw material gas into the processing container and feeding a decomposition restraint gas toward a peripheral portion of the subject to be processed to restrain the thermal decomposition of the raw material gas.

DETAILED DESCRIPTION

Figure 1:
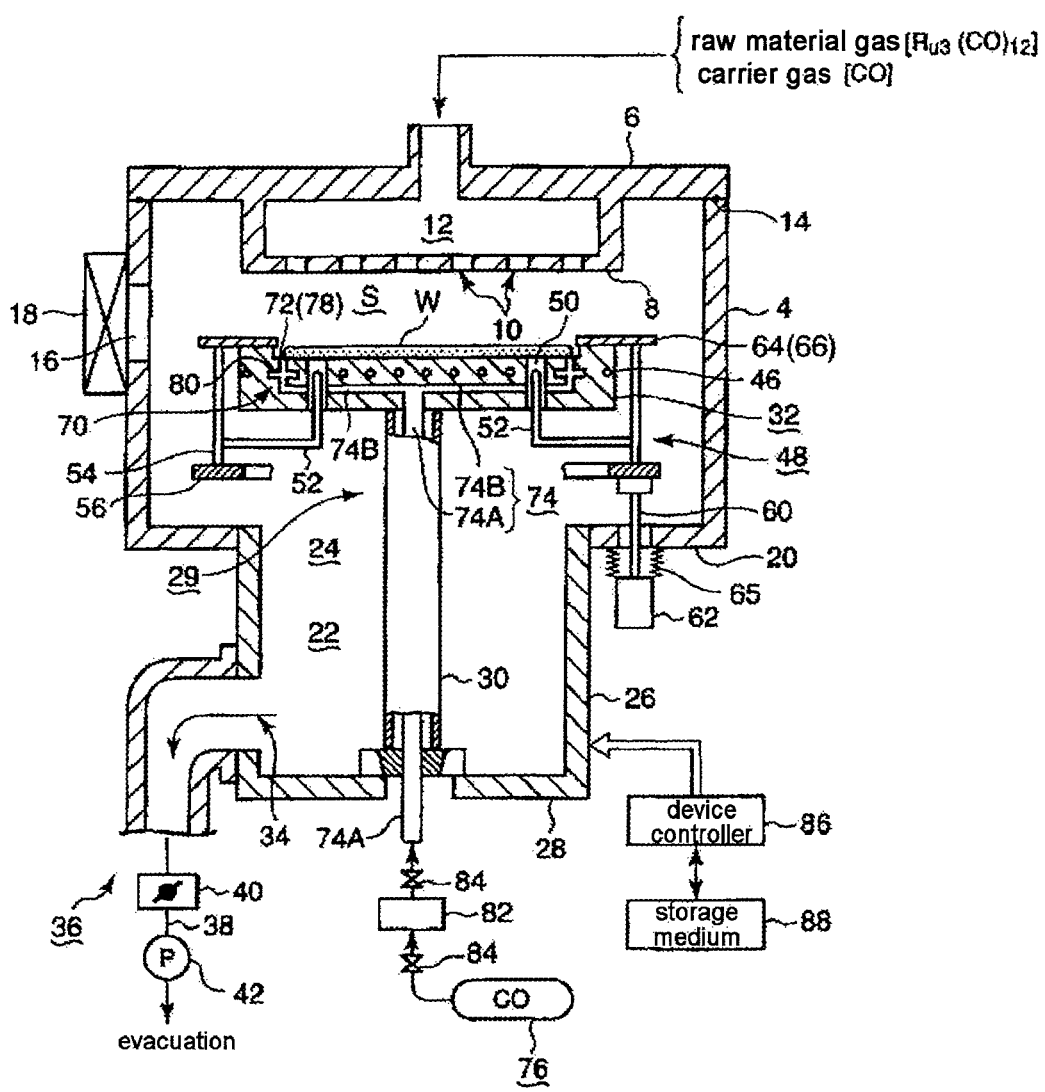
FIG. 1 is a cross sectional view showing a thin film forming apparatus employing a placing table structure according to the present invention.
Figure 2:
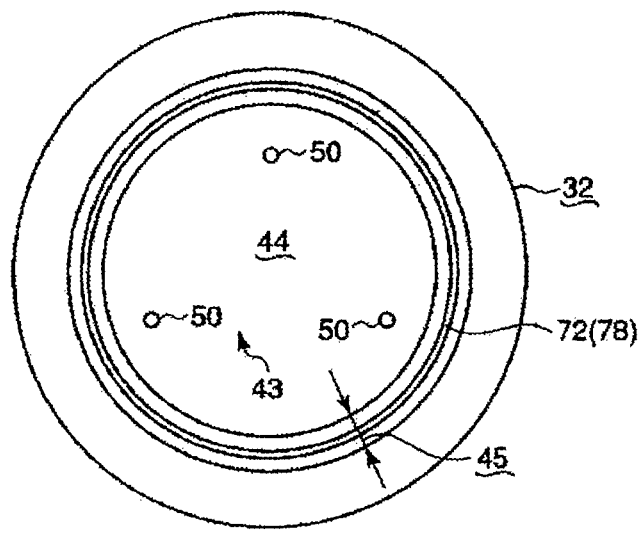
FIG. 2 is a plan view showing a placing surface of a placing table which is a top surface of the placing table.
Figure 3:
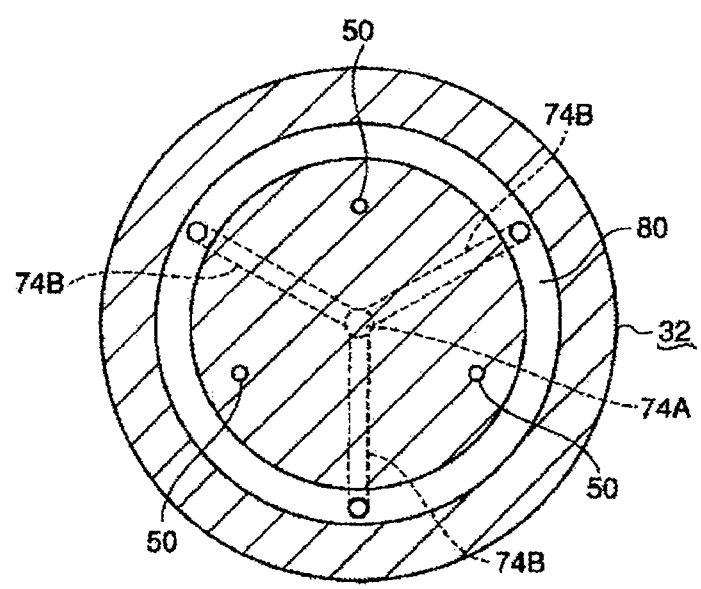
FIG. 3 is a transverse sectional view showing a diffusion chamber of the placing table.
Figure 4:
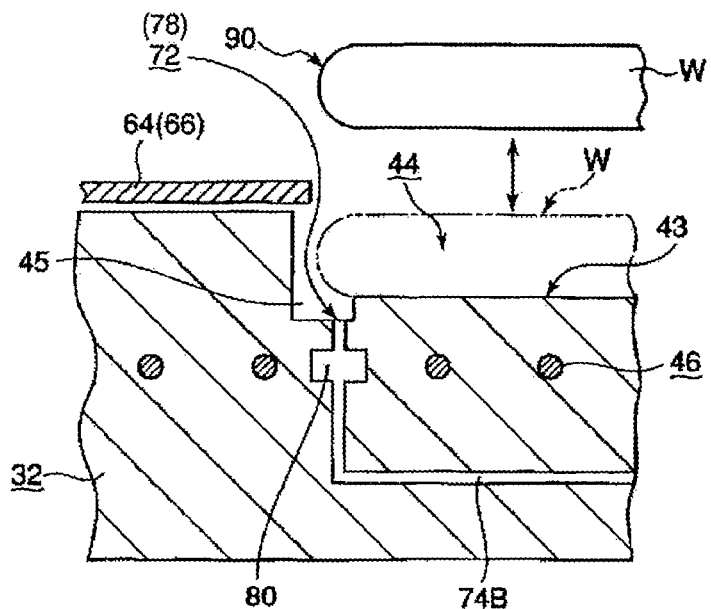
FIG. 4 is a partially-enlarged sectional view showing a part of the placing table.
Figure 5:
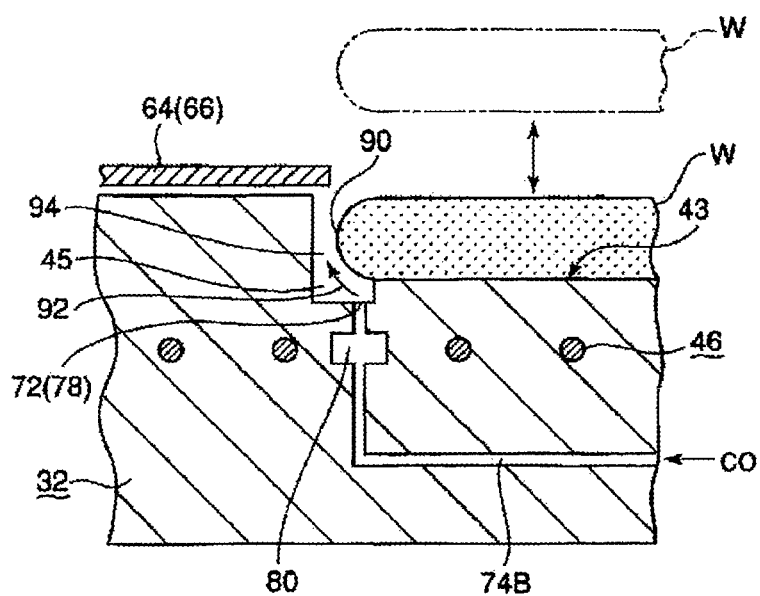
FIG. 5 is a sectional view for explaining an operation of a decomposition restraint gas feeding unit.

Hereinafter, the placing table structure according to the exemplary embodiment of the present invention will be described in detail with reference to accompanying drawings. FIG. 1 is a cross sectional view showing a thin film forming apparatus employing a placing table structure according to the disclosure. FIG. 2 is a plan view showing a placing surface of the placing table which is a top surface of the placing table. FIG. 3 is a transverse sectional view showing a diffusion chamber of the placing table. FIG. 4 is a partially-enlarged sectional view showing a part of the placing table. FIG. 5 is a sectional view for explaining an operation of a decomposition restraint gas feeding unit. In the following description, a Ru layer is formed as an example of a metal thin film by feeding raw material gas, such as metal carbonyl gas ($Ru_3(CO)_{12}$), together with carrier gas, such as CO gas.

As shown in FIG. 2, a film forming apparatus 2 includes a processing container 4, which has a substantially circular sectional shape and is made from aluminum or an aluminum alloy. A shower head 6 is provided on the ceiling of processing container 4 to supply a predetermined gas, that is, film forming gas into processing container 4. In addition, a plurality of gas injection holes 10 are formed at a gas injection surface 8 formed at the bottom surface of shower head 6, so that the film forming gas is injected into processing space S through gas injection holes 10.

A gas diffusion chamber 12 is formed in shower head 6. The film forming gas introduced into gas diffusion chamber 12 is horizontally diffused and then discharged through gas injection holes 10 communicated with diffusion chamber 12. Shower head 6 may be formed by using nickel, a nickel alloy, such as HASTELLOY (registered trademark), aluminum or an aluminum alloy. The metal carbonyl gas ($Ru_3(CO)_{12}$) is used as the raw material gas to form the thin film. The raw material gas is sublimated and then carried by the carrier gas, such as the CO gas. A seal member 14, such as an O-ring, is provided at the bonding section between shower head 6 and the upper opening of processing container 4 for the air-tightness of processing container 4.

In addition, a loading/unloading opening 16 is formed at the sidewall of processing container 4 to load or unload the subject to be processed, such as a semiconductor wafer W, into or from processing container 4. A gate valve 18 is installed in loading/unloading opening 16 to open or close loading/unloading opening 16.

In addition, an exhaust space 22 is formed in the vicinity of a bottom part 20 of processing container 4. In detail, an opening 24 having a large size is formed at the center of bottom part 20 of processing container 4 and a cylindrical partition wall 26 having a bottom part 28 may extend downward from opening 24. Opening 24 and cylindrical partition wall 26 may define exhaust space 22. In addition, a placing table structure 29 is uprightly installed on bottom part 28 of cylindrical partition wall 26 defining exhaust space 22 such that semiconductor wafer W to be processed can be mounted on placing table structure 29. In detail, placing table structure 29 may include a hollow cylindrical support 30 and a placing table 32 fixedly bonded to the upper end of hollow cylindrical support 30. Details of placing table structure 29, which is the technical feature of the present invention, will be described later.

Opening 24 of exhaust space 22 has a diameter smaller than the diameter of placing table 32. Thus, processing gas flowing through the outer peripheral portion of placing table 32 is introduced into the lower portion of placing table 32 and then introduced into opening 24. Cylindrical partition wall 26 is formed at the lower lateral portion thereof with an exhaust port 34 communicated with exhaust space 22. Exhaust port 34 is connected to an exhaust system 36. Exhaust system 36 has an exhaust pipe 38 in which a pressure regulating valve 40 and a vacuum pump 42 are sequentially installed. Therefore, gas is exhausted from processing container 4 and exhaust space 22, so that the pressure can be adjusted to a predetermined level.

In addition, as described above, placing table 32 is installed upright at the center of processing container 4 by cylindrical support 30. For instance, cylindrical support 30 may include a ceramic material, such as aluminum nitride (AlN). In addition, placing table 32 may include a ceramic material, such as aluminum nitride (AlN). A circular recess 44 (see, FIG. 2) is formed on a placing surface 43 (see, FIG. 4) of placing table 32. Circular recess 44 has a depth corresponding to the thickness of wafer W and a diameter slightly larger than the diameter of wafer W. Wafer W is received in circular recess 44.

As shown in FIG. 4, a groove 45 having a rectangular sectional shape can be formed at a boundary portion of circular recess 44 by cutting the boundary portion of circular recess 44. Groove 45 has an annular (ring) shape formed along the circumference of placing table 32. A gap between groove 45 and the outer peripheral portion of wafer W may serve as a gas stagnation space. For instance, groove 45 has a width of about 4 mm. Thus, the lower surface of the peripheral portion of wafer W narrowly faces an opening of groove 45. In addition, groove 45 may not be formed and omitted.

In addition, a heater 46 can be installed in placing table 32 as a heating unit. For instance, heater 46 is buried in placing table 32 in a predetermined pattern shape. In this case, heater 46 can be arranged over a region having a diameter larger than a diameter of a region where semiconductor wafer W is placed. For instance, heater 46 can be arranged over the whole area of the top surface of placing table 32. Heater 46 is connected to an electric feed bar (not shown) inserted into cylindrical support 30, and power is applied to heater 46 from an external heat source so that the temperature of heater 46 can be controlled to the desired level. In addition, for instance, heater 46 is electrically divided into an inner zone and an outer zone concentrically surrounding the inner zone in such a manner that the temperature control (power control) can be independently performed for the inner and outer zones.

In addition, a pin elevating unit 48 is installed on placing table 32 to move up and down wafer W. In detail, a plurality of pin insertion holes 50, for instance, three pin insertion holes 50 are provided in placing table 32 (only two pin insertion holes are shown in FIG. 1). Pin elevating unit 48 includes push pins 52, which are bent in an L-shape and movably inserted into pin insertion holes 50.

Each push pin 52 is supported by a support rod 54 extending perpendicular to push pin 52 (only two push pins are shown in FIG. 1). A lower end of each support rod 54 is connected to a push ring 56 having a circular ring shape and made from a ceramic material, such as alumina. Push ring 56 is supported by an upper end of an elevating rod 60 extending through bottom part 20 of processing container 4. Elevating rod 60 can be moved up and down by an actuator 62. That is, wafer W is moved up and down by moving elevating rod 60 up and down.

In addition, a flexible bellows 65 is provided between actuator 62 and a predetermined portion of bottom part 20 of processing container 4 where elevating rod 60 extends. Thus, elevating rod 60 can be moved up and down while keeping air-tightness in processing container 4.

A ring member 64 prepared as a thin ring plate is placed on the top surface of placing table 32 adjacent to the outer peripheral portion of wafer W. As shown in FIG. 4, ring member 64 may serve as a cover ring 66 for preventing the thin film from being deposited on the outer peripheral portion of placing table 32. In addition, a diameter of an inner peripheral surface of ring member 64 is slightly larger than the diameter of wafer W. Ring member 64 (cover ring 66) can be made by using a ceramic material, such as nitride aluminum or alumina ($Al_2O_3$). In addition, ring member 64 (cover ring 66) is fixed to the upper end of each support rod 54. Therefore, ring member 64 (cover ring 66) can move up and down integrally with push pin 52.

In addition, a decomposition restraint gas feeding unit 70, which is the technical feature of the present invention, is installed in placing table 32 to feed decomposition restraint gas for restraining the thermal decomposition of the raw material gas. In detail, as shown in FIGS. 2 to 5, decomposition restraint gas feeding unit 70 mainly includes a gas discharge port 72 formed along the circumference of placing surface 43 of placing table 32 corresponding to the outer peripheral portion of wafer W, a gas path 74 communicated with gas discharge port 72, and a restraint gas source 76 for storing the decomposition restraint gas. Restraint gas source 76 is connected to gas path 74. The decomposition restraint gas includes CO gas having an identical composition to the gas generated when the raw material gas ($Ru_3(CO)_{12}$) is thermally decomposed.

Gas discharge port 72 is open at a part of placing surface 43, that is, at the bottom surface of groove 45. In addition, as shown in FIG. 2, gas discharge port 72 is defined by an annular slit 78 formed along the outer circumferential portion of placing table 32. For instance, slit 78 has a width of about 1 mm.

Gas path 74 communicated with gas discharge port 72 may include a main gas path 74A formed through cylindrical support 30 and branch gas paths 74B formed in placing table 32 while branching from the upper end of main gas path 74A. Although three branch gas paths 74B having the same angle are shown in FIG. 3, the number of branch gas paths 74B may not be limited to this number. In addition, a diffusion chamber 80 is formed at an immediate below of gas discharge port 72 along the outer peripheral portion of placing table 32. The front end of each branch gas path 74B is communicated with diffusion chamber 80.

Thus, gas discharge port 72 is communicated with each branch gas path 74B through diffusion chamber 80. Accordingly, the CO gas, which is the decomposition restraint gas flowing into branch gas paths 74B, may be diffused along the outer peripheral portion of placing table 32 in diffusion chamber 80 so that the CO gas can be uniformly discharged through gas discharge port 72.

At this time, the discharged gas from gas discharge port 72 may be directed to the outer peripheral portion of wafer W. Therefore, the thin film may not be deposited on the outer peripheral portion of wafer W due to the decomposition restraint gas. Main gas path 74A is wider than branch gas path 74B. A flow rate controller 82, such as a mass flow controller, is installed in main gas path 74A, and opening/closing valves 84 are provided at both sides of main gas path 74A.

In order to control the operation of thin film forming apparatus 2, a control unit 86 including a computer may be provided. Control unit 86 controls the start and the end of gas feeding, the flow rate of gas, the process pressure, and the temperature of wafer W. Control unit 86 has a storage medium 88 for storing computer program to perform the control operation as described above. Storage medium 88 may include a flexible disc, a compact disc (CD), a CD-ROM, a hard disc, a flash memory or a DVD.

Hereinafter, the operation of film forming apparatus 2 having the above structure will be described.

First, semiconductor wafer W to be processed is loaded into processing container 4 through gate valve 18 and loading/unloading opening 16 by a transfer arm (not shown). Then, wafer W is transferred to push pin 52, which has been moved up together with ring member 64 of pin elevating unit 48. After that, as push pin 52 is moved down, wafer W is placed on placing surface 43, which is the top surface of placing table 32.

In this manner, if wafer W has been placed on placing table 32, a predetermined gas, for instance, the raw material gas for the thin film is supplied into processing space S from shower head 6. At this time, the flow rate of the raw material gas is controlled. Thus, processing container 4 can be maintained at the predetermined process pressure. For instance, if the Ru layer is formed, the $Ru_3(CO)_{12}$ gas is supplied as the raw material gas together with the CO gas serving as the carrier gas.

Then, power is applied to the heater installed on the placing table 32 so that wafer W is heated to the predetermined process temperature through placing table 32. Accordingly, the Ru layer, which is a thin metal layer, is formed on the surface of wafer W through the thermal CVD process under the process conditions of the process pressure of about 13.3 Pa, and the wafer temperature of about 200° C. to about 250° C. In addition, shower head 6 and the sidewall of processing container 4 are also heated by a heater (not shown) to the temperature of about 75° C. to about 80° C.

In general, when forming the thin film through the above procedure, the raw material gas may be diffused radially outward of processing space S formed above wafer W and then introduced into exhaust space 22 after flowing downward from the outer peripheral portion of placing table 32. After that, the raw material gas is discharged to exhaust system 36 from exhaust space 22 through exhaust port 34. At this time, some of the exhaust gas flows into the gap formed between the back surface of wafer W and placing surface 43 by detouring around the peripheral portion (edge portion) of wafer W, so that the thin film may be unnecessarily deposited on the region corresponding to the flowing route of the raw material gas.

For this reason, according to the conventional thin film forming apparatus of the related art, the thin film is unnecessarily deposited from the outer peripheral portion of wafer W to the entire lateral side of wafer W. Specifically, the thin film is unnecessarily deposited on bevel portion 90 (see, FIGS. 4 and 5) or the back surface of wafer W. In particular, if the process condition is set with the high step coverage in order to ensure the embeddability for the various holes and recesses, the thin film may be formed in a fine gap and the formation of the undesired thin film may significantly occur.

However, according to the present embodiment of the disclosure, decomposition restraint gas feeding unit 70 is installed in placing table structure 29 to feed the decomposition restraint gas, such as the CO gas for restraining the thermal decomposition of the raw material gas, to the outer peripheral portion of wafer W, so that the thermal decomposition of the raw material gas may be restrained at the outer peripheral portion of wafer W, thereby preventing the formation of the undesired thin film on the outer peripheral portion of wafer W.

Specifically, as shown in FIG. 1, the CO gas is supplied to main gas path 74A of gas path 74 from a decomposition restraint gas source 76. At this time, the flow rate of the CO gas is controlled by a flow rate controller 82. Then, the CO gas reaches placing table 32 and flows through branch gas paths 74B.

Then, as shown in FIGS. 4 and 5, the CO gas is introduced into diffusion chamber 80 formed below the peripheral portion of wafer W. The CO gas is diffused in diffusion chamber 80 along the outer peripheral portion of placing table 32 and is discharged upward through annular slit 78 of gas discharge port 72. Thus, the CO gas is discharged toward the peripheral portion of the wafer W as indicated by an arrow 92 (see, FIG. 5). Thus, as mentioned above, the thermal decomposition of the raw material gas may be restrained, so that the thin film may not be deposited on bevel portion 90 or the back surface of the peripheral portion of wafer W.

In particular, since annular groove 45 is formed in placing table 32 corresponding to the peripheral portion of wafer W, as shown in FIG. 5, if wafer W is placed on placing surface 43, gas staying space 94 is formed between groove 45 and the outer peripheral portion of wafer W, and the CO gas discharged from gas discharge port 72 may be temporally stored in gas staying space 94. Therefore, the density of CO may be increased in the vicinity of gas staying space 94, so that the formation of the undesired thin film can be effectively prevented.

Hereinafter, the decomposition restraining mechanism by the CO gas of the $Ru_3(CO)_{12}$ gas, which is the raw material gas, will be explained. The $Ru_3(CO)_{12}$ gas performs the reversible thermal decomposition reaction according to the following chemical formula.

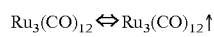

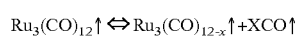

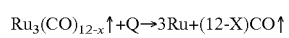

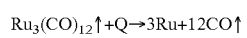

In the above chemical formula, "⇔" represents a reversible reaction, "↑" represents a gas phase, and the elements having no "↑" represent a solid phase. "Q" represents applying calorie.

As can be understood from the above chemical formula, according to the second chemical formula, the $Ru_3(CO)_{12}$ gas and the CO gas are reversibly generated through the thermal decomposition reaction. Thus, if the CO gas is supplied from the outside, the forward reaction (→) is restrained and the reverse reaction (←) is performed. As a result, the thermal decomposition of the $Ru_3(CO)_{12}$ gas is restrained so that the formation of the undesired thin film may be restrained. The thermal deposition reaction may include the forward reaction and the reverse reaction, and the thermal decomposition may refer to the forward reaction.

Since the CO gas, which is the decomposition restraint gas, is an identical gas to the composition of gas generated when the raw material gas is thermally decomposed, the CO gas may not exert great influence upon the formation of the thin film, which is different from the related art using Ar gas as purge gas. Thus, the thickness uniformity of the thin film formed on the top surface of wafer W may not be degraded, but may be improved.

Modification of Gas Discharge Port 72

Figure 6:
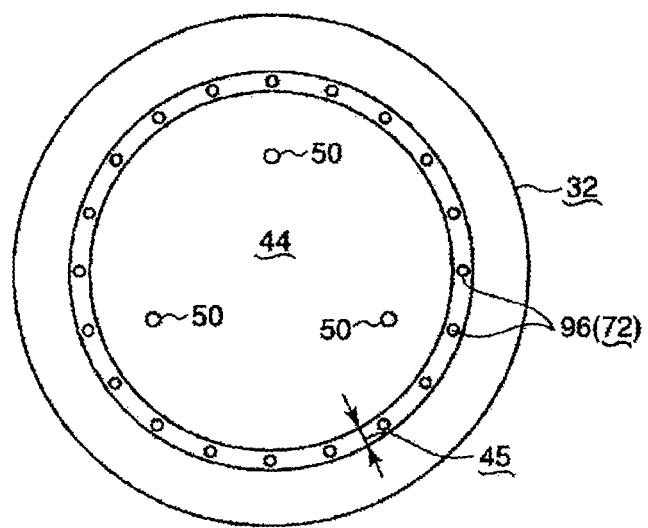
FIG. 6 is a view showing a placing surface formed with a modified gas discharge port.

According to the present embodiment, as shown in FIG. 2, annular slot 78 is formed as gas discharge port 72, but the present invention is not limited thereto. For instance, the gas discharge port can be configured as shown in FIG. 6. FIG. 6 is a view showing the placing surface formed with the modified gas discharge port. In the following description, details of the elements and structures that have been described with reference to FIG. 2 will be omitted in order to avoid redundancy and the same reference numerals will be designated to the same elements. Referring to FIG. 6, a plurality of discharge holes 96 are formed along the circumference of placing table 32.

The interval between discharge holes 96 is about 21 mm if exhaust hole 96 has a diameter of 1 mm, and about 31 mm if discharge hole 96 has a diameter of 1.2 mm. Preferably, discharge holes 96 have the same pitch. In this case, the CO gas can be uniformly discharged through discharge holes 96. The effect obtained from the previous embodiment can be achieved in the embodiment shown in FIG. 6.

Modification of Ring Member 64

Figure 7A:
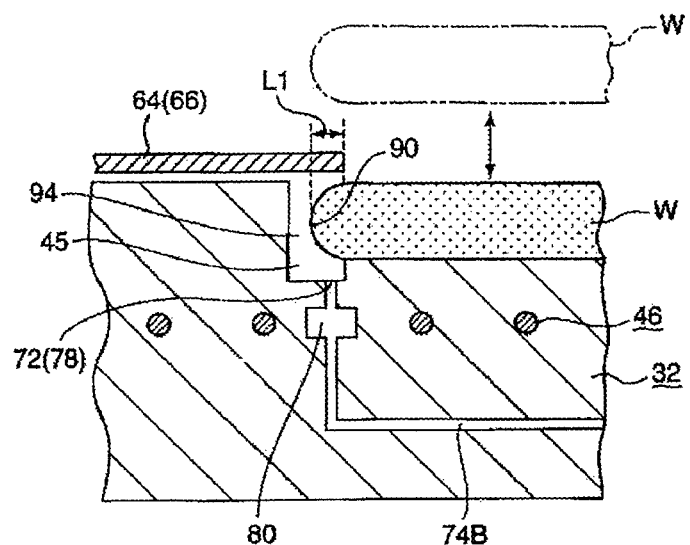
FIGS. 7A and 7B are enlarged sectional views showing the placing table including a modified ring member.
Figure 7B:
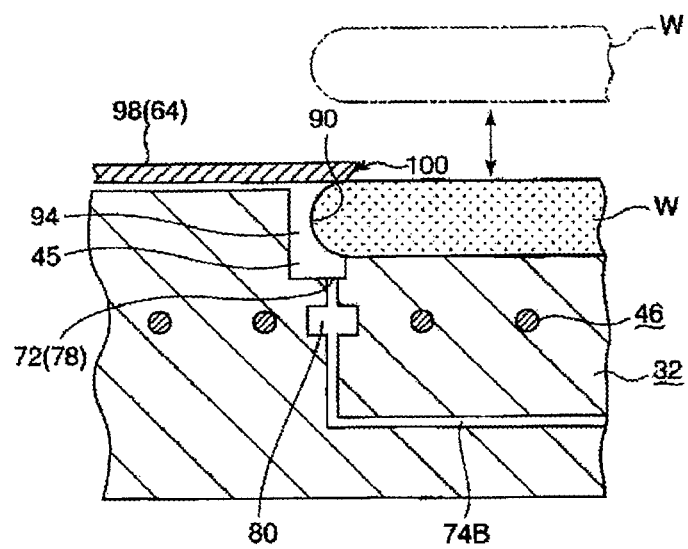

According to the embodiments described above, as shown in FIGS. 4 and 5, the inner peripheral portion of ring member 64 is slightly spaced apart from the edge portion of wafer W in the horizontal direction, but the disclosure is not limited thereto. FIGS. 7A and 7B are enlarged sectional views showing the placing table including the modified ring member. In the following description, details of the elements and structures that have been described with reference to FIGS. 4 and 5 will be omitted in order to avoid redundancy and the same reference numerals will be designated to the same elements.

Referring to FIG. 7A, the inner peripheral portion of cover ring 66 serving as ring member 64 may extend inward so that cover ring 66 overlaps with an edge portion of wafer W in the vertical direction by a predetermined length L1. That is, cover ring 66 is located above wafer W without making contact with wafer W.

In this case, an upper portion of gas staying space 94 defined by the outer peripheral surface of bevel portion (edge portion) 90 of wafer W and groove 45 are covered with the inner peripheral portion of cover ring 66. As a result, the CO gas can stay in gas staying space 94 for a long time, so that the formation of the undesired thin film on bevel portion 90 can be effectively prevented.

Referring to FIG. 7B, ring member 64 serving as cover ring 66 may be located slightly lower than ring member 64 shown in FIG. 7A, and the inner peripheral portion of ring member 64 extends inward to serve as a clamp ring 98. In detail, a bottom surface of the inner peripheral portion of clamp ring 98 makes contact with the top surface of the edge portion of wafer W so that the top surface of the edge portion of wafer W may be pressed against placing table 32. To this end, preferably, a taper surface 100 is formed at the inner peripheral portion of clamp ring 98.

In this case, the upper portion of gas staying space 94 defined by the outer peripheral surface of bevel portion (edge portion) 90 of wafer W and groove 45 are substantially covered (sealed) with the inner peripheral portion of clamp ring 98. As a result, the CO gas can stay in gas staying space 94 for a relatively long time as compared with the case shown in FIG. 7A, so that the formation of the undesired thin film on bevel portion 90 can be effectively prevented.

Evaluation Test for the Invention

Figure 8:
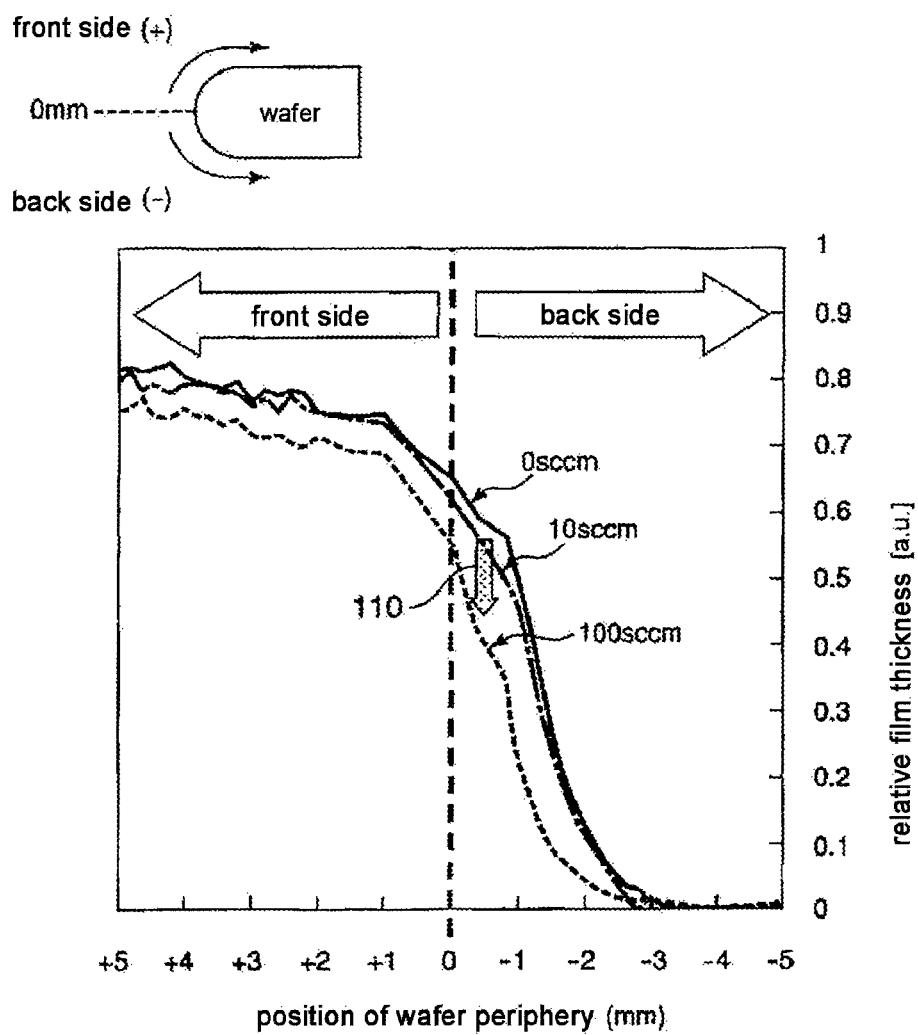
FIG. 8 is a graph showing the thickness of a thin film deposited on a peripheral portion (bevel portion) of a semiconductor wafer.

Hereinafter, the evaluation test performed with respect to the placing structure of the present invention will be described. FIG. 8 is a graph showing thickness of the thin film deposited on the peripheral portion (bevel portion) of the semiconductor wafer. The Ru layer is formed by using the placing table structure shown in FIG. 4 under the process conditions as follows: the temperature of the placing table 32 is 215° C., the flow rate of the carrier gas (CO gas) is 100 sccm, the flow rates of the decomposition restraint gas (CO gas) supplied to the peripheral portion of the wafer are three kinds of 0 sccm, 10 sccm and 100 sccm, thin film forming time is 90 sec, and the diameter of the wafer is 300 mm.

Referring to the graph shown in FIG. 8, in the X-axis (position of the peripheral portion of the wafer), the center of the thickness at the peripheral portion of the wafer is represented as 0, the front side from the center is represented with "+" and the back side from the center is represented with "−". The position of the wafer is schematically shown in FIG. 8. In addition, in the Y-axis (thickness of relative thin film), the thickness of the relative thin film of the Ru layer is represented in an arbitrary unit (a.u.) and the XRF (X-ray fluorescence) is used to measure the thickness of relative thin film.

As shown in FIG. 8, when the flow rate of the decomposition restraint gas (CO gas) is supplied to the peripheral portion of the wafer is 10 sccm, the thickness profile is substantially identical to the thickness profile when the flow rate of the decomposition restraint gas is 0 sccm, and the thickness curves are substantially overlapped with each other. That is, the formation of the undesired Ru layer may be rarely prevented.

In contrast, if the flow rate of the decomposition restraint gas is 100 sccm, as indicated by an arrow 110, the formation of the undesired Ru layer is significantly reduced on the peripheral portion of the wafer. In detail, the thickness is reduced by 0.05 [a.u.] at the front side (+) of the peripheral portion of the wafer, and the thickness is reduced by 0.2 [a.u.] in maximum at the back side (−) of the peripheral portion of the wafer. That is, the formation of the undesired Ru layer may be effectively prevented. Therefore, when the flow rate of the decomposition restraint gas is about 1.06 sccm/cm [=100 sccm/(30 cam×π)], the effect of the present invention appears to be exhibited.

Raw Material Gas

Although the $Ru_3(CO)_{12}$ gas, which is a material for metal carbonyl, is used as the raw material gas in the above embodiments, the disclosure is not limited thereto. The metal carbonyl raw material gas may include at least one of the elements selected from the group consisting of $Ru_3(CO)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$ and $Ta(CO)_5$.

Subject to be Processed

In addition, although the semiconductor wafer is used as the subject to be processed in the above embodiments, the semiconductor wafer may include a silicon substrate or a compound semiconductor substrate such as GaAs, SiC or GaN. Furthermore, the present invention is not limited to the above substrates, but may be applied to a substrate such as a glass substrate or ceramic substrate.

What is claimed is:

1. A method of forming a thin film on an upper surface of an object, the object also comprising a backside surface and a beveled edge between the upper surface and the backside surface, the method comprising:

feeding a raw material gas causing a reversible decomposition reaction, from an upper side of the object toward the upper surface of the object, wherein the object is placed on a placing table in a processing container, and wherein the raw material includes a metal carbonyl raw material gas selected from the group consisting of $Ru_3(O)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$ and $Ta(CO)_5$;

decomposing the raw material gas with a thermal decomposition scheme thereby forming the thin film on the upper surface of the object from the metal of the raw material gas; and while feeding the raw material gas to the object, also feeding carbon monoxide (CO) as a decomposition restraint gas from a lower side of the object upward past the beveled edge of the object, thereby restraining the thermal decomposition of the raw material gas so as to prevent the thin film from being formed on the beveled edge of the object and on the backside surface of the object.

2. The method of claim 1, wherein the feeding of the decomposition restraint gas from the lower side of the object is conducted from a gas discharge port located at a lower side of a peripheral portion of the object.

3. The method of claim 2, wherein the decomposition restraint gas is stored in a diffusion chamber disposed at the lower side of the peripheral portion of the object before being discharged from the discharge port.

4. The method of claim 1, wherein the decomposition restraint gas is stored temporarily at a gas staying space formed at a lower side of a peripheral portion of the object before being fed upward past the beveled edge of the object.

* * * * *